Jan. 27, 1970 G. A. GILMOUR ET AL 3,492,497

TRANSISTOR LOGARITHMIC TRANSFER CIRCUIT

Filed Sept. 28, 1966 2 Sheets-Sheet 1

WITNESSES

Wm. B. Sellers

Leon M. Garman

INVENTORS
George A. Gilmour and
Henry Dottle, Jr.
BY E. F. Possessky
ATTORNEY

United States Patent Office 3,492,497
Patented Jan. 27, 1970

3,492,497

TRANSISTOR LOGARITHMIC TRANSFER CIRCUIT

George A. Gilmour and Henry Dottle, Jr., Pleasant Hills, Pittsburgh, Pa., assignors to Westinghouse Electric Corporation, Pittsburgh, Pa., a corporation of Pennsylvania Filed Sept. 28, 1966, Ser. No. 582,606
Int. Cl. G06g 7/24
U.S. Cl. 307—229 16 Claims

ABSTRACT OF THE DISCLOSURE

Herein disclosed in a logarithmic transfer circuit, including means for applying an input current signal to the collector-emitter path of a transistor and means for holding the transistor base and collector at a substantially common but variable potential level, whereby the resulting output signal taken at the emitter of the transistor is a logarithmic function of the input signal.

The present invention relates to logarithmic transfer circuits and more particularly to transfer circuits in which a transfer element is used to produce a logarithmic transfer function.

In a logarithmic transfer circuit, an output signal is generated as a logarithmic function of an input signal. Typically, the logarithmic output may be generated at an amplified level, and the range of input signal amplitudes and frequencies for which logarithmic amplification is produced characteristically depends on the arrangement and operation of the transfer circuit. Useful applications in which logarithmic transfer circuits can be employed include vacuum measurement circuitry, radiation and neutron detection circuitry and other instrumentation and analog computational or control circuitry.

A PN junction can provide a logarithmic relationship between voltage and current over a relatively wide input current signal amplitude range, and one well-known logarithmic amplifier accordingly uses a silicon diode as a logarithmic element. Output voltage is held in a logarithmic relationship to the input current without drift and loading error by means of a high gain operational amplifier which is connected in parallel with the diode.

More recently, it has been observed that use of the transfer conductance of a silicon transistor results in a better logarithmic characteristic than that resulting from use of a diode if the transistor collector-base voltage is held at or near zero volts, as reported by C. T. Sah in Transactions IRE Electron Devices, ED–9, p. 94 (1962). Logarithmic operation of a transistor is explained by analysis of the collector current which is composed of a volume component from the emitter and another component comprising the leakage current around the base-collector PN junction. When the base-collector potential is held at or near zero volts, the leakage current around the base-collector PN junction is minimized and the collector current is substantially equal to the volume current component from the emitter. The collector current is accordingly determined by the following:

$$I_C=I_0e(qV_{EB}/kT)$$

where:

$V_{EB}$=emitter-base voltage
$I_0$=constant
$q$=electronic charge
$k$=Boltzmann's constant
T=absolute temperature.

The transistor base-emitter voltage is thus defined as a logarithmic function of the collector current, as follows:

$$V_{EB}=kT/q \log_e I_C-C_1$$

where $C_1$=a constant.

As shown and described in U.S. Patent No. 3,237,028 by J. F. Gibbons, logarithmic transfer circuitry evolved into a transistorized form in which the transistor collector is made the transfer circuit input and the collector-emitter path is connected in parallel with a high gain operational amplifier with the transistor base and collector held at ground or zero potential. With improved logarithmic element performance provided by the transistor, improved logarithmic transfer circuit operation could thus be realized as measured for example by extension of the range of input signal amplitudes over which logarithmic transfer could be obtained with satisfactory linearity and accuracy.

Difficulties nonetheless persist with the operational amplifier-transistor logarithmic transfer circuitry. In particular, circuit frequency response is limited as determined primarily by gain and stability characteristics of the operational amplifier. Typically, the upper frequency response limit is about 100 cycles per second for a current input of $10^{-10}$ amperes, and it increases to a value of about 10 kilocycles per second for a current input of $10^{-5}$ amperes. At higher input current values within the operational amplifier-transistor logarithmic transfer circuit operating range, the upper frequency response limit is typically about constant at the 10 kc. value. Further, the operational amplifier must supply operating direct current to the logarithmic transistor in order to keep zero net current at the input. Because suitable stable high gain operational amplifiers are at best not readily available at higher steady or pulsating direct current ratings, satisfactory logarithmic transfer for input currents much in excess of $10^{-2}$ amperes is difficult if not impractical to obtain. It is also noteworthy that the use of an operational amplifier generally introduces complexity to the transfer circuit and accordingly creates disadvantages in cost and operating reliability.

In accordance with the broad principles of the present invention, a logarithmic transfer circuit includes a transistor logarithmic element which is operable over an extended range of input signal amplitudes and frequencies. Means are provided for applying an input current signal to the transistor collector-emitter path and means are provided for holding the transistor collector and base at a substantially common but variable potential level over the operating range of input current amplitudes. The difference between the variable base potential level and the emitter potential is a logarithmic function of the input current signal amplitude. The transistor base-collector voltage control is preferably achieved by means of a field effect transistor connected in a source follower circuit arrangement between the logarithmic transistor base and collector regions.

It is therefore an object of the invention to provide a novel transistor logarithmic transfer circuit which operates with improved performance.

Another object of the invention is to provide a novel transistor logarithmic transfer circuit which can be operated over an extended range of input signal amplitudes.

A further object of the invention is to provide a novel transistor logarithmic transfer circuit which is characterized with improved manufacturing economy and increased simplicity for better operating reliability.

An additional object of the invention is to provide a novel and economic transistor logarithmic transfer circuit which provides logarithmic transfer for input current levels as great as one ampere or more.

It is another object of the invention to provide a novel transistor logarithmic transfer circuit with good linearity and accuracy over a relatively wide range of input signal amplitudes.

It is a further object of the invention to provide a novel transistor logarithmic transfer circuit which operates with improved stability and frequency response particularly as compared to prior art operational amplifier logarithmic transfer circuits.

It is an additional object of the invention to provide a novel extended range transistor logarithmic transfer circuit in which the collector-base voltage control circuitry supplies only transistor base drive current and no transistor collector-emitter current.

These and other objects of the invention wil become more apparent upon consideration of the following detailed description along with the attached drawings, in which.

Figure 6:
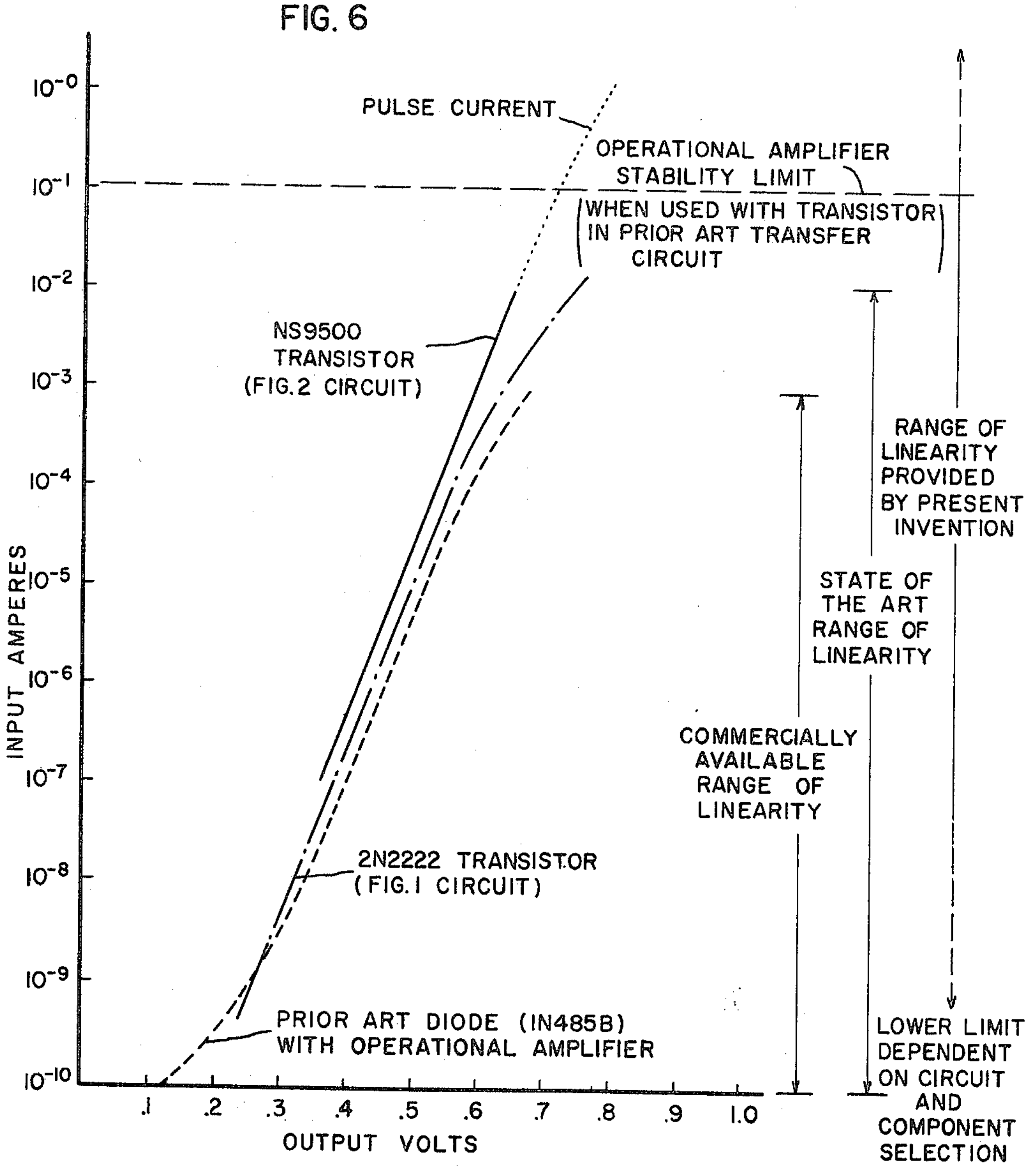

FIG. 6 graphically shows comparative logarithmic transfer performance of the prior art circuit arrangements and circuits arranged in accordance with the principles of the present invention.

Figure 1:
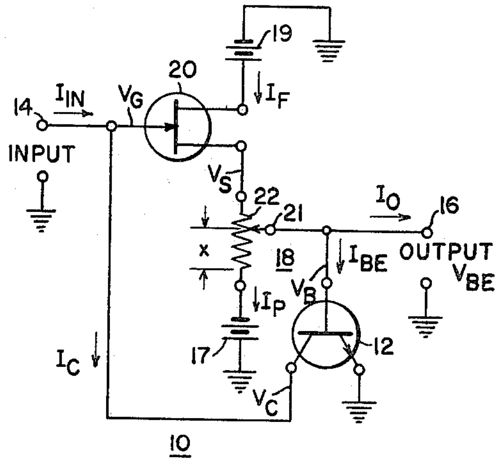
FIGURE 1 shows an embodiment of the invention in which a logarithmic transfer circuit includes a transistor provided with collector-base voltage control by means including an active element in the preferred form of a field effect transistor.

More specifically, there is shown in FIG. 1 a logarithmic transfer circuit 10 arranged in accordance with the principles of the invention. It includes an NPN transistor 12 such as a 2N2222 unit which operates as a solid state logarithmic element on a positive input direct current signal applied at an input terminal 14. If the input signal is a negative current, a PNP transistor (not shown) can be used in place of the illustrated NPN transistor. The logarithmic transistor 12 and all other components in the circuit 10 are preferably in separate component form but can if desired be partly or possibly fully integrated into mololithic structure.

The emitter terminal of the logarithmic transistor 12 is preferably connected to ground or common potential, and the collector terminal is connected to the input terminal 14. Further, the logarithmic transistor base terminal is connected to an output terminal 16 so that the base-emitter voltage $V_{BE}$ forms the output signal. Logarithmic transfer results from the previously indicated fact that the output voltage $V_{BE}$ varies as a logarithmic function of the collector component $I_C$ of the emitter current when the transistor collector and base regions are held at substantially equal potentials.

In general, the logarithmic transistor emitter resistance limits the upper end of the input current signal operating range because, with increasing temperature at the higher operating current levels, material increases in the emitter resistance, cause nonlinearity between the output voltage and the input current. By "nonlinearity," it is meant to refer to the linearity property of the curve representing $V_{BE}$ as a function of the collector current $I_C$ on a logarithmic scale.

The upper end of the operating range can be relatively extended by selection of a logarithmic transistor having a base-emitter PN junction with relatively low resistance and good temperature stability or by cooling the logarithmic transistor or both. A good silicon planar junction transistor is accordingly desirable, and among presently available transistors the 2N2222 and NS9500 units have been found to provide satisfactory logarithmic characteristics. Other presently available types may perform just as well or better and further improved transistor types could well be developed in the future. It is further noted as background information that the inherent operating range and particularly the high end of the range of prior art logarithmic transfer circuits as well as circuitry arranged in accordance with the principles of the present invention can normally be further extended within limits by externally correcting for nonlinearity with appropriate known skew and amplitude correction circuitry connected to the transfer circuit output.

Generally, the upper end of the operating range is also higher if relatively short input current pulses are used rather than a steady input current signal since less heating is then applied to the logarithmic transistor. However, in previous logarithmic transfer circuits, the amplitude of input current pulses has been restricted by overall circuit instability and operational amplifier current limits. The extent to which the logarithmic transistor can be linearly operated in the pulse mode at higher input levels has accordingly been correspondingly restricted. As more fully explained hereinafter, one advantage of the present invention is that relatively higher input current pulses can be accepted for logarithmic transfer as a result of circuit operating characteristics, and in effect the high end of the input signal operating range is correspondingly extended In order to hold the logarithmic transistor collector and base terminals at substantially equal potentials and thereby provide for logarithmic transfer, a follower circuit 18 is connected from the input terminal 14 and the logarithmic transistor collector terminal to the logarithmic transistor base terminal. More particularly, the collector and base potentials are maintained at a substantially equal level which is varied to produce an output voltage $V_{BE}$ varying as a logarithmic function of the input current signal $I_{IN}$. In causing the base potential substantially to track the collector potential at various input signal levels, the circuit 10 operates with improved logarithmic transfer circuit performance as compared to performance realized from typical logarithmic transfer circuit arrangements such as those in which logarithmic transistor collector and base potentials are held substantially equal at a substantially fixed or ground voltage level.

In producing the potential tracking function, the follower circuit can be embodied in various forms. By definition, a follower circuit is herein meant to refer to any of the circuits, usually electronic, wherein the circuit output voltage follows or attempts to follow the circuit input voltage. The definition thus includes a cathode follower as applied to vacuum tubes, an emitter follower as applied to bipolar transistors, a source follower as applied to unipolar transistors and a voltage follower as applied to operational amplifiers.

Preferably, the follower circuit 18 includes a solid state active element in the form of a field effect transistor 20 such as an FE300 unit. In this instance, the field effect transistor 20 has an N type channel in order to provide increasing turn on for increases in positive input signals. A P channel unit can be similarly employed for negative input signals. However, either type can be employed with either signal polarity. Preferably, the field effect transistor 20 is a separate component but it can be integrated with other circuit elements in a monolithic structure.

The field effect transistor (FET) 20 is connected in source follower relation in the circuit 18 and accordingly provides very high input impedance such as 10 megohms. More particularly, the FET gate terminal forms the follower input terminal and is coupled to the logarithmic transistor collector terminal and the input terminal 14 while the FET source terminal is coupled through a follower output terminal 21 to the logarithmic transistor base terminal to supply base drive current thereto.

Since the gate current is always substantially zero because of the high input impedance, the collector emitter current $I_C$ is virtually equal to the circuit input current $I_{IN}$ thereby making the desirably measured and actually measured current values virtually the same.

A positive voltage supply 19 having a value such as +15 volts is connected from common to the FET drain terminal. In a circuit branch common to the source-drain circuit and the source-gate circuit, a negative voltage supply 17 having a value such as −15 volts is connected from common through the resistance of a potentiometer 22 to the FET source terminal. An arm of the potentiometer 22 is connected to the follower output terminal 21 to provide the circuit coupling between the FET source terminal and the logarithmic transistor base terminal.

In the source follower circuit 18, the source potential $V_S$ is always at a more positive value than the value of the FET gate potential $V_G$ whether a negative input signal or the preferred positive input signal is employed. The highest potentiometer potential is thus above the gate potential $V_G$ and assurance is provided that the poteniometer tap potential $V_B$ can be made equal to the FET gate potential $V_G$ and the collector potential $V_C$. In selecting the type of field effect transistor to be employed, it is noted that the field effect transistor should be operable under the gate-source voltage condition just described. If a P channel type field effect transistor is employed, opposite polarities apply and the source potential should be more negative than the gate potential. In general, therefore, the source potential $V_S$ should be selected so that the absolute value of the gate potential $V_G$ lies on the lower side of the absolute range of the drain and source potentials.

At the startup of circuit operation, the input signal $I_{IN}$ is applied to the input terminal 14 and it may have an amplitude value at the bottom of the input signal amplitude operating range. For example, the current $I_{IN}$ might have a value of $10^{-8}$ amperes at a voltage $V_G$ equal to 0.25 volt. For the minimum input condition, the tap point of the potentiometer 22 is adjusted to establish the proper follower D.C. output level, namely one at which $V_B$ substantially equals $V_G$ or $V_C$. This set up technique is recommended because base voltage tracking error is thus minimized at the bottom end of the operating range where such error has more critical effect on overall circuit linearity and accuracy as subsequently explained more fully.

The functioning of a source follower circuit is similar to that of a cathode follower circuit in which a pentode is employed. Accordingly, the closed loop gain of the circuit 18 is substantially determined by the following formula as indicated in Reference Data for Radio Engineers, 4th edition, International Telephone and Telegraph Corporation, p. 448:

$$\text{closed loop gain} = \frac{g_m R_L}{1 + g_m R_L + R_L/r_d} \quad (1)$$

where:

$g_m$=transconductance of the FET 20
$R_L$=combined resistance of the potentiometer 22 and the follower circuit load
$r_d$=internal FET resistance.

At low circuit input current values, the load resistance $R_L$ is nearly equal to the potentiometer resistance $R_P$ which is selected to make the product $g_m R_L$ substantially greater than one plus $R_L/r_d$ thereby producing a circuit gain of about unity. A typical value for internal resistance $r_d$ is 100,000 ohms, and a potentiometer having a suitable resistance value such as 5,000 ohms accordingly results in near unity circuit gain.

The approximation of unity gain from Equation (1) becomes poorer with increasing input current $I_{IN}$. This is because the logarithmic transistor base is effectively a variable resistance in parallel with part of the potentiometer resistance $R_P$. For higher input current values, the base resistance is decreased so that $R_L$ is no longer approximated by $R_P$. In effect, increased loading placed on the follower circuit by increased base drive current $I_{BE}$ causes departure from the unity gain approximation. However, increased voltage tracking error thus produced at higher input current values has only negligible effect on the logarithmic characteristic of the circuit.

To illustrate the loading consideration, it is noted that the channel current $I_F$ might typically have a range from about 3 milliamperes to 3.1 milliamperes for values of $I_{IN}$ from $10^{-8}$ amperes to $10^{-3}$ amperes. Above the latter input level, logarithmic transistor drive current $I_{BE}$ becomes a significant fraction of the channel current $I_F$. The fraction increases with increasing input signal level, for example at $I_{IN}$=0.1 ampere $I_F$ might equal 10 milliamperes with $I_P$ still equal to slightly more than 3 milliamperes.

It is further noted that the output current $I_0$ is preferably made a negligibly small part of the total load current $I_0+I_{BE}$. For example, a high input impedance amplifier (not shown) can provide the circuit output coupling while keeping $I_0$ small.

With near unity circuit gain, any change in the level of the input potential $V_G$ is accompanied by a substantially equal change in the level of the feedback voltage across the potentiometer 22. Thus, the source potential level $V_S$ changes by the amount of the input change.

The follower circuit output potential $V_B$ is at the potentiometer tap point in order to provide the proper output D.C. voltage level and it is defined by:

$$V_B = x(V_S - V_{17}) + V_{17} \quad (2)$$

Where: $x$=fractional location of the potentiometer tap. After the potentiometer is preset as previously described, the value of $x$ is fixed at $$\frac{V_B - V_{17}}{V_S - V_{17}}$$

For example, with $V_{17}$=−15 v. and $V_B$=0.25 v., the source voltage $V_S$ might equal 1.0 v. and $x$ thus equals 15.25/16=0.95.

For an input change $\Delta V_G$, an equal unity gain change is made in $V_S$ and the follower output becomes:

$$V_B + \Delta V_B = (V_S + \Delta V_G - V_{17}) + V_{17}$$

Since $V_B$ is originally set equal to $V_G$, $V_B$ is caused substantially to track $V_G$ as required for logarithmic circuit transfer, and the tracking accuracy depends on the size of the input voltage change and the value of $x$. To minimize voltage tracking error, the circuit parameters are preferably selected so that $x$ has a value near unity. Typically, the operating range of input voltages is relatively small such as from 0.25 v. to 0.7 v., and the maximum voltage tracking error due to tapping at the preselected $x$ value is within a tolerable range. When the follower circuit gain is decreased at higher load operation, a tolerable $x$ error effect is produced in a manner similar to that described for the "unity" gain case.

In summary of the follower circuit operation thus far described, the transistor base and collector potentials are held at a substantially equal but variable level over the input current operating range in order to produce wide range, reliable and economic logarithmic transfer. Thus, for accurate and linear logarithmic operation of the transistor 12, a base potential $V_B$ within about 0.1 v. of the collector potential $V_C$ is typically needed at a low input current value such as $10^{-8}$ amperes, whereas a difference up to 1.0 v. or more typically provides good logarithmic transfer at higher input current values such as $10^{-2}$ amperes or more. The circuit 10 is highly effective in producing such base voltage tracking or better tracking as required for good wide range logarithmic transfer.

In order to facilitate the present description, the term "substantially equal" or "substantially common" is used herein to define the relationship produced between the potentials $V_B$ and $V_C$ by the follower circuit 18. When so used, the term is meant to refer to a tracking condition in which the difference $V_B - V_C$ is small enough for reasonably good logarithmic transfer to be obtained at the particular input signal level under consideration. The term "substantially equal" or "substantially common" can thus have reference to a relatively small voltage difference at low input signal levels or a larger voltage difference at higher input signal levels.

In terms of physical events in the logarithmic transfer circuit 10, a change in the amplitude of the input signal current $I_{IN}$ results in a change in the FET gate potential $V_G$ and the logarithmic transistor collector potential $V_C$. Input line capacitance is charged or discharged depending on whether the input current change is an increase or a decrease. For example, an increase in the input current $I_{IN}$ charges the input line capacitance and raises the gate potential $V_G$ and the gate-source voltage difference $V_G - V_S$. Thus, the FET PN junction becomes less reverse biased to reduce pinching in the FET channel. The channel current $I_F$ accordingly increases to raise the voltage drop across the potentiometer 22.

A higher resulting potential $V_B$ applied to the logarithmic transistor base increases the base drive current $I_{BE}$ and thus provides for carrying the higher input current through the logarithmic transistor collector-emitter path and for discharging the line capacitance to a level resulting in circuit equilibrium. At equilibrium, the gate potential $V_G$ has a value which results in a channel current $I_F$ that causes the base potential $V_B$ to equal $V_G$ (and $V_C$) and simultaneously provide the base drive current $I_{BE}$ required to allow the input current $I_{IN}$ to flow at its increased level through the transistor collector-emitter path. Further, the feedback voltage across the potentiometer 22 when summed with the other voltages in the FET source-gate circuit produces a voltage difference $V_G - V_S$ which allows the required equilibrium chanel current $I_F$ to flow. Equilibrium is achieved quickly after any input signal increase or decrease and it may be realized with critical or near critical circuit damping with or without a certain amount of circuit hunting.

The unity or lower closed loop voltage gain characteristic of the follower circuit 18 enables the transfer circuit 10 to be operated substantially without gain instability. Accordingly, conventionally imposed frequency operating limits do not apply to logarithmic transfer circuits arranged in accordance with the principles of the invention. A frequency limit of operation does arise in the logarithmic transfer circuit 10 as a result of response time required to achieve changed field effect operation in the FET 20 and for changed base-emitter gating in the logarithmic transistor 12. However, frequency response of the logarithmic transfer circuit 10 is sufficiently great to provide for extended frequency input pulsing applications.

Further, the FET 20 need only supply a relatively small base-emitter drive current to the logarithmic transistor 12 and input currents having a pulse amplitude as great as 0.5 ampere or more can be logarithmically transferred with stable amplifier and transfer circuit operation. In contrast, prior art operational amplifier logarithmic transistor transfer circuits have been limited by the requirement that the operational amplifier supply the total transistor emitter current including the collector component. The pulsating or steady direct current output capability of quality operational amplifiers normally is limited to about $10^{-2}$ amperes and logarithmic transfer of collector currents having a value of about $10^{-1}$ amperes or more has not been possible without the use of extensive and complicating power gain circuitry. In effect, therefore, the circuit 10 avoids placing a circuit limitation on logarithmic transistor operation at higher input current values and thereby provides an extended input signal amplitude operating range at the high end of the range.

Reasonably good logarithmic operation can be typically obtained for a transistor at input current singal values as small as $10^{-12}$ amperes unless a limit is produced at a higher value by the circuit in which the transistor is connected. For comparison purposes, it is therefore noted that the low end of the operating range of the transfer circuit 10 is highly dependent on circuit parameter selections. In particular, the low end is primarily determined by the FET input impedance and by the extent to which base-collector voltage tracking error is made to fall within the logarithmic operating requirements of the transistor 12.

Modified circuit forms can also function in accordance with the principles of the invention. For example, the FET source terminal can be connected directly (not indicated) to the logarithmic transistor base and the potentiometer 22 can be replaced by a fixed resistor (not shown). The B+ or B− voltage is then suitably varied (not indicated) to provide the preset equality between $V_B$ and $V_G$. As another example, the potentiometer 22 can be replaced by an active element such as a transistor (not shown) having its collector connected to the FET source and the logarithmic transistor base terminals so that the collector-emitter path is connected as a variable resistance between the FET source terminal and the B− supply. The resistively operated transistor accordingly has its base drive preset to produce preset equality between $V_B$ and $V_G$.

Figure 2:
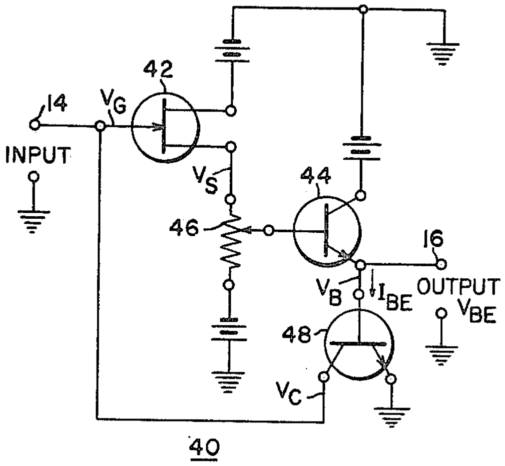
FIG. 2 shows another embodiment of the invention which is modified to enable higher input and output levels to be achieved.

Reference has already been made to FIG. 2 in which there is shown another logarithmic transfer embodiment of the invention arranged in the form preferred for providing further extended input current amplitude operation at the high end of the input curernt operating range. Thus, a circuit 40 includes an FET 42 such as an FE300 unit and otherwise is generally similar to the circuit 10 of FIG. 1. However, a solid state emitter follower amplifier including an NPN transistor 44 such as a 2N918 unit is connected between the tap point of a 5000 ohm or other suitably valued potentiometer 46 and the base of a logarithmic transistor 48 such as a NS9500 unit.

The amplifier transistor collector is connected to a suitable power source and the base-emitter voltage across the amplifier transistor 44 is substantially constant at a value such as about 0.7 volt with only negligible variation over the circuit operating range. Accordingly, the potentiometer presets operation takes the amplifier transistor base-emitter voltage into account in establishing equality between the potentials $V_B$ and $V_G$.

During circuit operation, base drive current for the amplifier transistor 44 varies with the FET channel current $I_F$. The collector-emitter current of the amplifier transistor 44 is thus controlled to produce required base drive current $I_{BE}$ through the logarithmic transistor 48 as the base potential $V_B$ is made to follow or track the input potential $V_G$ in a manner similar to that described for the embodiment of FIG. 1. With intermediate power gain, however, the potentiometer output current required to supply the current $I_{BE}$ at higher values of input current $I_{IN}$ is relatively reduced. Transfer nonlinearity otherwise obtained at higher input current values because of follower circuit loading is thus avoided to provide for further extended operation at the high end of the input current amplitude operating range. Since the circuit output is coupled to the FET 42 through an emitter follower circuit, a relatively low load impedance (not shown) can be used if desired. It is also noted that intermediate power amplification can be employed where the channel current limit of the FET 42 is not high enough to meet the base drive requirements of the logarithmic transistor 48 in the higher part of the input current operating range even though transfer circuit nonlinearity may not occur at the channel current limit of the FET 42.

As further illustration of possible modifications, it is noted that in general any high input impedance amplifier with gain close to unity can be connected between the input and the logarithmic transistor base provided the phase is not reversed. The follower circuit can also employ an amplifier with gain greater than unity such as an operational amplifier or an FET connected with its drain as the output, but the circuit is then more complicated to provide the proper D.C. output level and to reduce the gain back to about unity.

Figure 5:
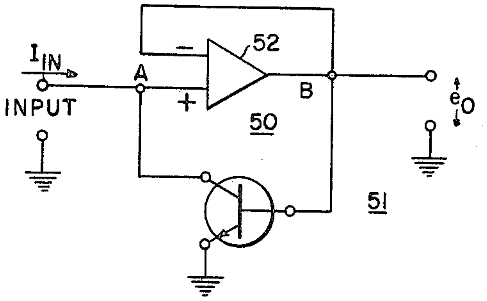
FIG. 5 shows an operational amplifier embodiment of the invention.

As shown in FIG. 5, for example, a voltage follower circuit 50 including a noninverting operational amplifier 52 can be connected in a transfer circuit 51 between the logarithmic transistor collector and base terminals. Voltage feedback from the amplifier output provides for near unity gain operation. The gain of the amplifier 52 is preferably selected at the least value required for the lowest input current to be measured. The circuit 51 normally can produce better logarithmic characteristics at the low end of the operating range as compared to the circuit 10 of FIG. 1. However, the circuit 51 has stability and/or response time limitations similar to those of prior art operational amplifier transistor logarithmic transfer circuits. Nonetheless, the limitations are less restrictive than those of the prior art because the operational amplifier 52 supplies only the logarithmic transistor base current.

Figure 4:
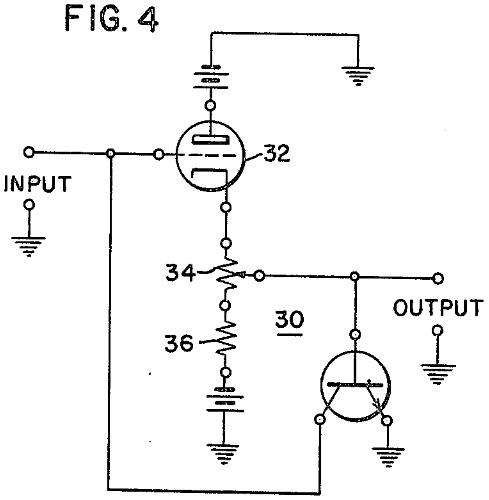
FIG. 4 shows a further embodiment of the invention in which an electrometer tube is employed.

In FIG. 4, there is shown another logarithmic transfer circuit embodiment of the invention which operates in a manner similar to that described for the circuit 10 of FIG. 1. Thus, a circuit 30 includes a triode vacuum tube 32 connected as a cathode follower with its plate connected to a B+ voltage supply, its grid connected to the input, and its cathode connected through a potentiometer 34 and a fixed resistor 36 to a B− supply. The tube 32 is preferably a low voltage or electrometer tube. If desired, an appropriately connected tetrode or pentode electrometer tube can be employed in place of the triode tube 32.

Figure 3:
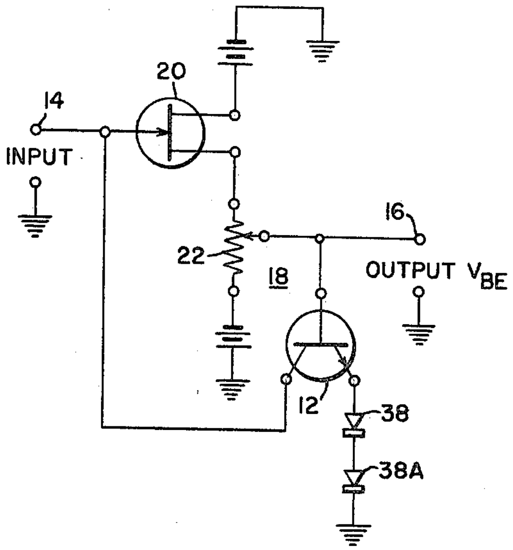
FIG. 3 shows an additional embodiment of the invention which is modified to enable higher voltage level output signals to be achieved.

Another logarithmic transfer circuit embodiment of the invention is shown in FIG. 3. In this case, the circuit 10 of FIG. 1 is employed and one or more semiconductor diodes 38 are connected serially between the logarithmic transistor emitter terminal and ground. The PN junction in each diode exhibits a logarithmic voltage-current relation, and the output voltage level at the output terminal 16 is thus increased by the use of the diodes 38. It is preferable that the junction characteristics of the diodes and the logarithmic transistor base-emitter PN junctions be closely matched to avoid non-logarithmic circuit transfer operation. If the diodes 38 are integrated with the logarithmic transistor 12 in a common solid state block, junction matching and logarithmic circuit operation are most readily achieved. Other circuit components could also be integrated into this common block.

In summary of the invention, a transistor logarithmic transfer circuit includes an arrangement for holding the logarithmic transistor base and collector potentials at a substantially common value which varies in relation to the emitter potential as a logarithmic function of the collector-emitter current. The substantial collector and base voltage equalization is preferably maintained by a follower circuit which includes an active element preferably in the form of a field effect transistor. Improved logarithmic transfer circuit performance and manufacturing economy can be realized. In particular, logarithmic transfer can be linearly and accurately achieved over an extended range of input signal amplitudes and over an extended range of input signal frequencies.

Typically, the preferred field effect transistor logarithmic transfer circuit forms can be arranged in accordance with the principles of the invention to provide a response time of better than 0.2 microsecond and an output voltage accuracy better than 2% per decade over an input current signal range such as from $10^{-8}$ or $10^{-7}$ amperes to 1 ampere or more. Component selection and choice of embodiment can shift the operating range to other values such as from $10^{-10}$ amperes to $10^{-2}$ amperes or possibly from $10^{-10}$ or less to 1 ampere or more by the use of a high quality field effect transistor. The embodiment of FIG. 1 showed excellent logarithmic characteristics over the range of $10^{-10}$ to $10^{-3}$ amperes with the use of a 2N2222 logarithmic transistor, an FE300 field effect transistor and a 5000 ohm potentiometer. The embodiment of FIG. 2 provided excellent logarithmic characteristics over the range of $10^{-7}$ amperes up to pulses of 1 ampere with the use of an FE300 field effect transistor, an NS9500 logarithmic transistor and a 5000 ohm potentiometer. Lower quality transfer was achieved with the embodiment of FIG. 2 for pulses up to 3 amperes.

Comparative performance data is presented in FIG. 6 to show improvements associated with the present invention over logarithmic transfer circuits of the prior art. There are included input current linear operating ranges generally available respectively in logarithmic transfer circuits which are presently commercially available, logarithmic transfer circuits which are known to the art, and logarithmic transfer circuits arranged in accordance with the principles of the present invention.

The foregoing description has been presented only to illustrate the principles of the invention. Accordingly, it is desired that the invention not be limited by the embodiments described, but, rather, that it be accorded an interpretation consistent with the scope and spirit of its broad principles.

What is claimed is:

1. A logarithmic transfer circuit comprising a transistor having a base, an emitter and a collector and a collector-emitter path, means for directing an operating current through the collector-emitter path, and means for holding said collector and said base at a substantially common potential level and for varying the common collector-base potential level in relation to the emitter potential substantially as a logarithmic function of the operating current.

2. A logarithmic transfer circuit as set forth in claim 1 wherein at least one diode is coupled to said emitter in series relation with a path formed by said base and said emitter.

3. A logarithmic transfer circuit as set forth in claim 1 wherein said potential holding means comprises a follower circuit connected between said collector and said base.

4. A logarithmic transfer circuit as set forth in claim 1 wherein said potential holding means comprises a circuit connected between said collector and said base to supply the transistor base drive current and to hold the collector and base potentials substantially equal.

5. A logarithmic transfer circuit as set forth in claim 1 wherein said potential holding means comprises a circuit connected between said collector and said base and characterized with a closed loop voltage gain of less than unity.

6. A logarithmic transfer circuit as set forth in claim 1 wherein said potential holding means includes a field effect transistor and means for coupling said field effect transistor between said collector and said base in a circuit having a closed loop voltage gain less than unity.

7. A logarithmic transfer circuit as set forth in claim 1 wherein said potential holding means includes a source follower circuit connected between said collector and said base, said source follower circuit including a field effect transistor having a gate coupled to said collector, said field effect transistor having a source, and means coupling said source to said base.

8. A logarithmic transfer circuit as set forth in claim 7 wherein the last-mentioned means includes a potentiometer having its resistance connected between said source and a voltage supply, said potentiometer having a tap coupled to said base and being presettable to make the collector and base potentials substantially equal.

9. A logarithmic transfer circuit as set forth in claim 7 wherein the last-mentioned means includes a follower amplifier.

10. A logarithmic transfer circuit as set forth in claim 7 wherein said gate and said collector form a transfer circuit input, said base forms a transfer circuit output, and said emitter is coupled to a common potential.

11. A logarithmic transfer circuit as set forth in claim 7 wherein said field effect transistor has a drain coupled to a voltage supply of one polarity, the last-mentioned means including a circuit element having effective resistance and coupling said source to a voltage supply of the opposite polarity.

12. A logarithmic transfer circuit as set forth in claim 8 wherein a follower amplifier is connected between said potentiometer tap and said base.

13. A logarithmic transfer circuit as set forth in claim 1 wherein said potential holding means includes an electrometer vacuum tube and means for coupling said electrometer tube between said collector and said base in a cathode follower circuit.

14. A logarithmic transfer circuit as set forth in claim 3 wherein said voltage follower circuit includes an active element having an input coupled to said collector and an output coupled to said base, and means for establishing an active element output potential having an absolute magnitude greater than that and a polarity the same as that of the potential of said active element input.

15. A logarithmic transfer circuit as set forth in claim 12 wherein said follower amplifier is an emitter follower including a second transistor having a base coupled to said potentiometer tap and an emitter coupled to said base of said other transistor.

16. A logarithmic transfer circuit as set forth in claim 1 wherein said potential holding means includes a voltage follower circuit connected between said collector and said base, said voltage follower circuit including an operational amplifier which is feedback connected for operation at a gain less than unity.

References Cited

UNITED STATES PATENTS

| | | | |
|---|---|---|---|
| 2,601,485 | 6/1952 | Yetter | 324—123 XR |
| 2,999,169 | 9/1961 | Feiner | 307—230 |
| 3,089,968 | 5/1963 | Dunn | 328—142 XR |
| 3,129,420 | 4/1964 | Marez | 307—229 XR |
| 3,214,603 | 10/1965 | Von Urff | 307—229 |
| 3,320,530 | 5/1967 | Pearlman | 328—145 XR |
| 3,351,865 | 11/1967 | Dow et al. | 307—230 XR |
| 3,369,128 | 2/1968 | Pearlman | 307—229 |

JOHN S. HEYMAN, Primary Examiner

STANLEY T. KRAWCZEWICZ, Assistant Examiner

U.S. Cl. X.R.

235—197; 328—143, 145